(12) United States Patent
Franzon et al.

(10) Patent No.: US 9,762,434 B2
(45) Date of Patent: Sep. 12, 2017

(54) TEMPORAL REDUNDANCY

(75) Inventors: Paul D. Franzon, New Hill, NC (US); John Wilson, Raleigh, NC (US)

(73) Assignee: RAMBUS INC., Sunnyvale, CA (US)

( * ) Notice: Subject to any disclaimer, the term of this patent is extended or adjusted under 35 U.S.C. 154(b) by 628 days.

(21) Appl. No.: 14/236,572

(22) PCT Filed: Jul. 20, 2012

(86) PCT No.: PCT/US2012/047749
§ 371 (c)(1),
(2), (4) Date: Jun. 3, 2014

(87) PCT Pub. No.: WO2013/025311
PCT Pub. Date: Feb. 21, 2013

(65) Prior Publication Data
US 2014/0376364 A1    Dec. 25, 2014

Related U.S. Application Data (60) Provisional application No. 61/523,018, filed on Aug. 12, 2011.

(51) Int. Cl.
| | |
|---|---|
| H04L 12/24 | (2006.01) |
| G06F 11/20 | (2006.01) |
| H04L 1/22 | (2006.01) |
| H03L 7/18 | (2006.01) |
| H03L 7/23 | (2006.01) |
| H04L 1/00 | (2006.01) |

(52) U.S. Cl.
CPC ...... *H04L 41/0686* (2013.01); *G06F 11/2007* (2013.01); *H03L 7/18* (2013.01); *H03L 7/23* (2013.01); *H04L 1/0002* (2013.01); *H04L 1/22* (2013.01); *H04L 41/0659* (2013.01); *H04L 41/0668* (2013.01)

(58) Field of Classification Search
None
See application file for complete search history.

(56) References Cited

U.S. PATENT DOCUMENTS

| | | | |
|---|---|---|---|
| 7,130,304 B1 * | 10/2006 | Aggarwal | H04L 45/00 370/389 |
| 7,631,127 B2 | 12/2009 | Su et al. | |
| 7,783,309 B2 | 8/2010 | Joung et al. | |
| 7,860,104 B1 * | 12/2010 | Aggarwal | 370/395.3 |
| 8,953,605 B1 * | 2/2015 | Mehra | H04L 45/58 370/392 |

(Continued)

OTHER PUBLICATIONS

Contreras, Andres A., "Micronetworking: Reliable Communication on 3D Integrated Circuits," 2010 Masters Thesis, Utah State University. 97 pages.

(Continued)

*Primary Examiner* — Jenee Williams
(74) *Attorney, Agent, or Firm* — Womble Carlyle Sandridge & Rice LLP (57) ABSTRACT

A circuit is provided to facilitate temporal redundancy for inter-chip communication. When an inter-chip communication channel fails, data bits associated with the faulty channel are steered to a non-faulty channel and transmitted via the non-faulty channel together with data bits associated with the non-faulty channel at an increased data rate.

18 Claims, 9 Drawing Sheets

(56) References Cited

U.S. PATENT DOCUMENTS

| | | | | |
|---|---|---|---|---|
| 2001/0019536 A1* | 9/2001 | Suzuki | H04L 41/0654 | 370/226 |
| 2002/0110148 A1* | 8/2002 | Hickman | H04L 45/00 | 370/475 |
| 2002/0123362 A1* | 9/2002 | Kamel | H04L 1/0002 | 455/522 |
| 2002/0136232 A1* | 9/2002 | Dudziak | H04J 3/0664 | 370/445 |
| 2002/0167958 A1* | 11/2002 | Martin | H04L 49/103 | 370/429 |
| 2003/0063564 A1* | 4/2003 | Ha | H04L 12/5692 | 370/230 |
| 2003/0149715 A1* | 8/2003 | Ruutu | H04L 29/06 | 718/100 |
| 2004/0219920 A1* | 11/2004 | Love | H04L 1/0002 | 455/442 |
| 2004/0228285 A1* | 11/2004 | Moon | H04L 47/10 | 370/252 |
| 2005/0018639 A1* | 1/2005 | Friedrich | H04L 25/0262 | 370/338 |
| 2005/0157741 A1* | 7/2005 | Wu | H04L 12/185 | 370/432 |
| 2005/0201409 A1* | 9/2005 | Griswold | H04L 12/437 | 370/445 |
| 2006/0013126 A1* | 1/2006 | Yasuoka | H04L 12/4633 | 370/217 |
| 2006/0114881 A1* | 6/2006 | Chari | H04L 45/125 | 370/351 |
| 2006/0123152 A1 | 6/2006 | Koch et al. | | |
| 2006/0140114 A1* | 6/2006 | Cochran | H04L 1/24 | 370/229 |
| 2006/0203731 A1* | 9/2006 | Tiedemann, Jr. | H04L 47/10 | 370/235 |
| 2007/0091891 A1* | 4/2007 | Zwiebel | H04L 45/16 | 370/390 |
| 2007/0092011 A1 | 4/2007 | Ciccarelli et al. | | |
| 2007/0201393 A1* | 8/2007 | Srikrishna | H04W 52/286 | 370/318 |
| 2008/0051036 A1* | 2/2008 | Vaswani | H04L 45/20 | 455/69 |
| 2008/0095058 A1* | 4/2008 | Dalmases | H04L 45/00 | 370/237 |
| 2008/0247408 A1* | 10/2008 | Yoon | H04L 1/1657 | 370/408 |
| 2008/0270650 A1* | 10/2008 | Bracamontes Del Toro | G06F 13/4022 | 710/105 |
| 2009/0003232 A1* | 1/2009 | Vaswani | H04L 45/00 | 370/252 |
| 2009/0085183 A1 | 4/2009 | Mitchell et al. | | |
| 2009/0252065 A1* | 10/2009 | Zhang | H04L 41/082 | 370/256 |
| 2010/0278086 A1* | 11/2010 | Pochiraju | H04W 28/20 | 370/310 |
| 2010/0284414 A1* | 11/2010 | Agarwal | H04L 49/351 | 370/401 |
| 2011/0134854 A1* | 6/2011 | Hong | H04W 8/005 | 370/329 |
| 2011/0286450 A1* | 11/2011 | Wijnands | H04L 45/04 | 370/390 |
| 2012/0044800 A1* | 2/2012 | Coltro | H04J 3/14 | 370/217 |
| 2012/0327942 A1* | 12/2012 | Terabe | H04L 12/40039 | 370/400 |
| 2013/0163514 A1* | 6/2013 | Ikemoto | H04L 45/54 | 370/328 |
| 2013/0229911 A1* | 9/2013 | Nagata | H04W 40/02 | 370/228 |
| 2013/0322231 A1* | 12/2013 | Csaszar | H04L 45/16 | 370/217 |

OTHER PUBLICATIONS

PCT Preliminary Report on Patentability dated Feb. 27, 2014 (Chapter I) in International Application No. PCT/US2012/047749. 6 pages.

* cited by examiner

TEMPORAL REDUNDANCY

RELATED APPLICATION

This application is a 371 of PCT International Application No.: PCT/US2012/047749, filed Jul. 20, 2012, which claims priority to U.S. Provisional Patent Application No. 61/523,018, filed Aug. 12, 2011, which are hereby incorporated by reference in their entirety.

BACKGROUND

In a 3D chip stack, failures can occur in any multi-bit interconnect structure between chips. A typical solution to this problem is to provide spare interconnect channels that can be used to replace faulty channels as needed. Multiplexers and demultiplexers can be used to steer signals from a faulty channel to one of the spare channels. The number of spare channels, however, is typically pre-determined and thus inflexible. Furthermore, in 3D chip stacks connected using through silicon vias (TSVs), spare TSVs consume precious silicon "real estate" and routing resources.

BRIEF DESCRIPTION OF THE FIGURES

In the figures, like reference numerals refer to the same figure elements.

DETAILED DESCRIPTION

In embodiments of the present disclosure, spare transmission capacity in the time domain is utilized to provide protection against failed inter-chip communication channels. When a fault occurs in a channel, a control circuit in a transmitting chip steers data bits for that channel to other functional channels which operate at an increased clock rate. This temporal redundancy, when used in place of or in addition to spatial redundancy (i.e., using physical spare channels), improves fault tolerance at little additional cost.

Figure 1:
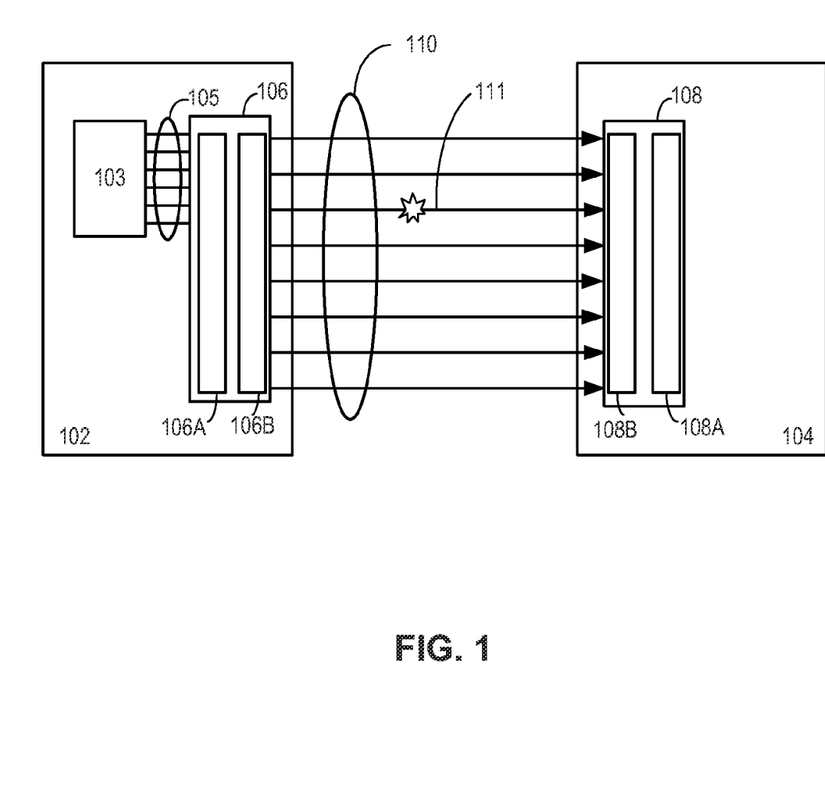
FIG. 1 presents a block diagram illustrating communication between two chips with temporal redundancy, in accordance with one embodiment.

FIG. 1 illustrates a high-level diagram of a system including two integrated chips 102 and 104 that facilitate temporal redundancy. In this example, chip 102 is communicating with chip 104 via a number of channels 110. Chip 102 includes core circuitry 103 and an interface circuit 106 coupled to the core circuitry 103 via a plurality of internal channels 105. Interface circuit 106 is capable of transmitting data bits received from the core circuitry 103 to chip 104 with temporal redundancy. Chip 104 also includes core circuitry 107 and an interface circuit 108 coupled to the core circuitry via a plurality of internal channels 109. Interface circuit 108 is capable of receiving data bits and coordinating with circuit 106 to facilitate temporal redundancy.

In the situation when every channel in channel group 110 functions normally, no temporal redundancy is used, and all channels in channel group 110 are used to transmit sets of data bits in parallel. Interface circuit 106 includes a control circuit 106A and an I/O circuit 106B. Control circuit assigns bits received from core circuitry for transmission via respective channels by the I/O circuit 106B. When a fault occurs to one of the channels, for example channel 111, control circuit 106A steers the bits previously assigned to channel 111 to one or more of the other functional channels, and operates these channels at a higher clock rate. Correspondingly, interface circuit 108 in chip 104 also includes a control circuit 108A and I/O circuit 108B. Control circuit 108A operates I/O circuit 108B at a higher clock rate, and re-distributes the bits received from the functional channels accordingly to account for the failed channel 111. As a result, the system can accommodate the fault on channel 111 without using a physical spare channel.

This temporal redundancy configuration does not incur significant cost, because a transmission channel typically does not operate at its highest possible data rate. In other words, there is usually some reserved transmission capacity that is unused. Also, operating a channel at a slightly higher data rate generally does not cause a significant amount of power penalty.

Although the example in FIG. 1 illustrates operation in one transmission direction, a similar configuration can be implemented in the reverse direction. Therefore, temporal redundancy can be provided in both unidirectional and bidirectional channels.

Figure 2A:
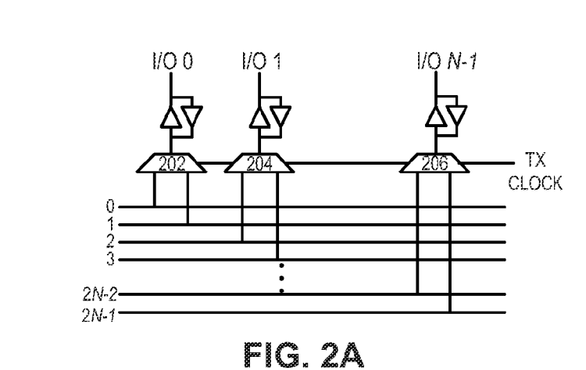
FIG. 2A illustrates an exemplary transmission circuit that operates at double the data rate of the internal signal channels, in accordance with one embodiment.

In many cases, a communication channel can operate at a higher data rate than a chip's internal data rate. For example, assume that a chip has n×N internal data channels, where n is greater than one. The chip operates at n times the data rate of the external communication channels when every n internal data channels are coupled to a 1×n serializer/ deserializer (SERDES), which is coupled via an input/output (I/O) device to one of N external communication channels. FIG. 2A illustrates one of such examples where n is 2. Internal channels 0 and 1 are coupled to SERDES 202, internal channels 2 and 3 are coupled to SERDES 204, and internal channels 2N−2 and 2N−1 are coupled to SERDES 206. The other end of a SERDES is coupled to one of N input/output (I/O) devices (which are denoted as I/O 0, I/O 1, . . . , I/O N−1) for transmitting to and receiving from an external channel. All the SERDESs operate at a transmission clock rate that is twice as fast as the internal data clock. Each I/O device can be a transmitter/receiver pair.

Figure 2B:
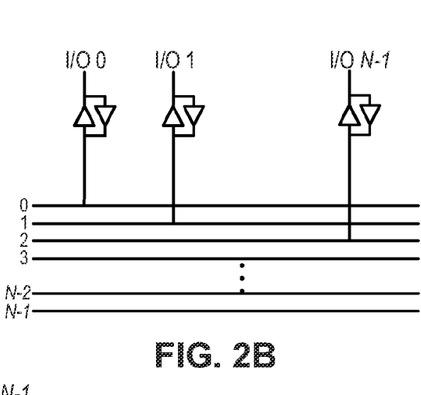
FIG. 2B illustrates an exemplary transmission circuit that operates at the data rate of the internal signal channels, in accordance with one embodiment.

In other embodiments, the external channels can operate at the same data rate as the internal data channel, as illustrated in FIG. 2B. In this example, an internal data channel is coupled to an external channel via a transmitter/receiver pair. A clock signal used for external transmission is the same as an internal data clock.

Figure 2C:
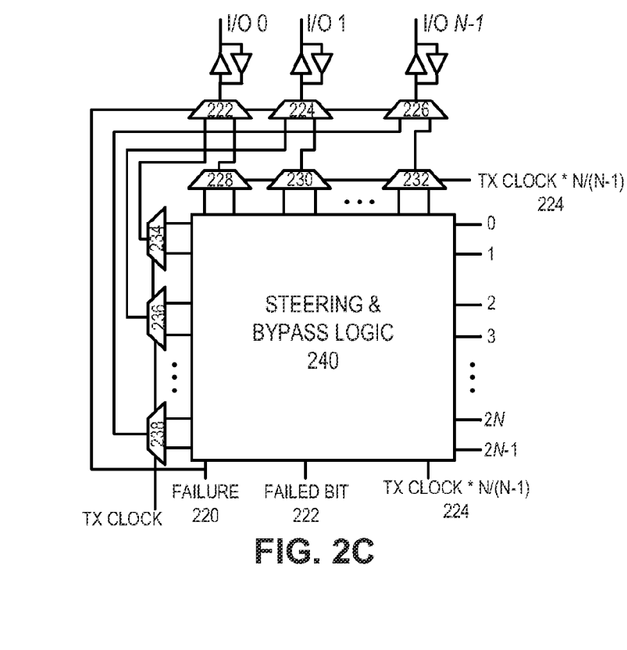
FIG. 2C illustrates the function of a steering and bypass logic which provides temporal redundancy for inter-chip communication, in accordance with one embodiment.

FIG. 2C illustrates how a control circuit provides the temporal redundancy in a chip that operates its external channels at twice the data rate of its internal data rate. In this example, a steering and bypass logic 240 is coupled to 2N internal data channels (labeled 0, 1, 2, . . . , 2N−1, to the right of circuit 240). Coupled to the left of circuit 240 are a number of SERDESs 234, 236, and 238, which facilitate double-data-rate transmission and receiving (similar to SERDESs 202, 204, and 206 in FIG. 2A). Also coupled to steering and bypass logic 240 are a second set of SERDESs 228, 230, and 232 operating at a faster transmission clock to provide temporal redundancy (referred to as "back-up" SERDESs). A third set of MUX/DEMUXs 222, 224, and 226 are used to couple the signals from the normal-operation SERDESs (e.g., 234, 236, and 238) or signals from the back-up SERDESs (e.g., 228, 230, and 232) to the external channels. Steering and bypass logic 240 also has as inputs a failure indication signal 220, a failed bit signal 222, and an increased transmission clock signal 224. The following description is provided based on a transmission operation. The receiving operation can be carried out in a similar manner, in the reverse direction.

During normal operation when all the external channels are healthy, failure indication signal 220 places steering and bypass logic 240 in a bypass mode. Consequently, SERDESs 234, 236, and 238 are coupled to internal data channels 0 to 2N−1. For example, SERDES 234 is coupled to internal data channels 0 and 1, SERDES 236 is coupled to internal data channels 2 and 3, and SERDES 238 is coupled to internal data channels 2N and 2N−1. Furthermore, failure indication signal 220 instructs MUX/DEMUXs 222, 224, and 226 to select the outputs of SERDESs 234, 236, and 238 as their respective input, which are in turn coupled to I/O 0, I/O 1, and I/O N−1, respectively.

When one I/O channel fails (say I/O 1), failure indication signal 220 is asserted, and failed bit signal 222 indicates the channel that has failed. In response, steering and bypass logic 240 enters the steering mode to provide temporal redundancy, and steers the input signals to back-up SERDESs 228 to 232 (except for SERDES 230, since I/O 1 has failed). Steering and bypass logic 240 distributes the data signals originally designated for I/O 1 (via SERDES 236 and MUX/DEMUX 224) to other healthy back-up SERDESs (such as 228 and 232). Furthermore, when redistributing the data to the back-up SERDESs, steering and bypass logic 240 uses the increased transmission clock 224 (which is configured to be N/(N−1) times the normal transmission clock rate) to re-sample the data signals, thereby allowing them to be transmitted at the increased clock rate by the back-up SERDESs. In addition, selection MUX/DEMUXs 222, 224, and 226 are configured, by failure indication signal 220, to select the inputs from back-up SERDESs 228, 232, etc.

The example in FIG. 2C illustrates how temporal redundancy is provided when one out of N channels fails. In general, if R out of N channels fail, an increased transmission clock would be provided at N/(N−R) times the original transmission clock rate. Furthermore, failed bit indication signal 222 may contain multiple bits to indicate one or more indices of failed channel(s).

Figure 3:
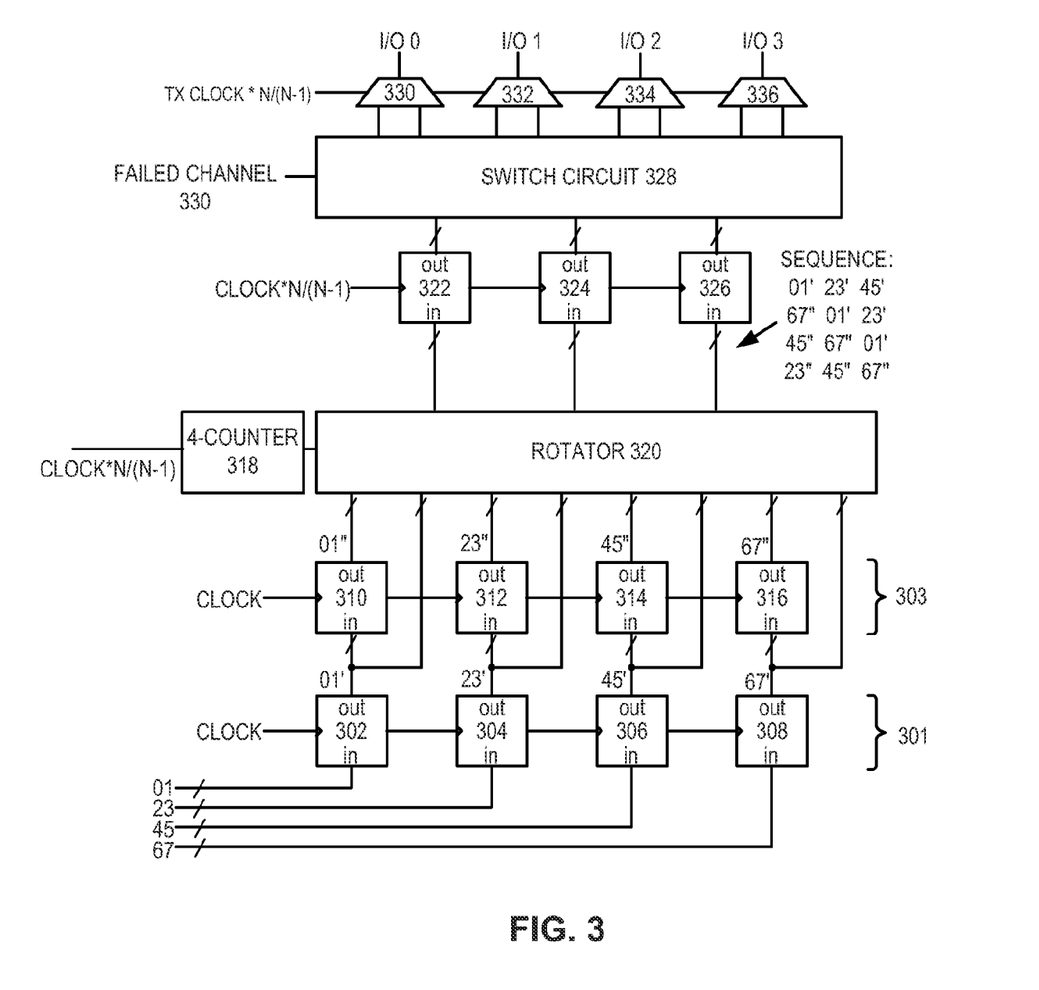
FIG. 3 illustrates an exemplary circuit that facilitates temporal redundancy for inter-chip communication, in accordance with one embodiment.

FIG. 3 illustrates an exemplary circuit implementation of a steering logic for providing temporal redundancy for one failure in a four-channel transmission block. This circuit can be part of a bypass and steering logic (such as the steering portion of logic 240 in FIG. 2C). The purpose of this circuit is to re-sample the 8 input signals when one channel fails and transmit them via the rest three channels at an increased transmission clock rate. In this example, four external channels, denoted as I/O 0, 1, 2, and 3, operate at double the internal clock rate. The steering logic has eight data inputs via four two-bit-wide buses, denoted as 01, 23, 45, and 67. Also included in this circuit are a first-stage buffer 301 and a second-stage buffer 303. Buffer 301 includes four two-bit registers, 302, 304, 306, and 308. Buffer 303 includes four two-bit registers, 310, 312, 314, and 316.

The outputs of buffers 301 and 303 are coupled to a rotator 320, which is controlled by a 4-counter 318. The outputs of rotator 320 are coupled to another buffer stage which includes three two-bit registers 322, 324, and 326. The outputs of these registers are coupled to a switch circuit 328, which switches the input signals to three of four SERDESs 330, 332, 334, and 336, based on a failed channel indication signal 330.

To provide temporal redundancy, both buffer stages 301 and 303 are triggered by the internal data clock (denoted as CLOCK). The outputs of buffer stage 301 are delayed by one clock cycle (denoted as 01', 23', 45', and 67' respectively). The outputs of buffer stage 303 are delayed by two clock cycles (denoted as 01", 23", 45", and 67" respectively).

The outputs of both buffer stages 301 and 303 are sent into rotator 320. Rotator 320 is triggered by the output of 4-counter 318, which counts from 0 to 3 based on an increased clock signal (CLOCK*N/(N−1)). Rotator 320 is configured to couple three out of its eight inputs (namely, 01', 01", 23', 23", 45', 45", 67', and 67") to the three outputs, based on the value produced by 4-counter 318. The table below shows exemplary outputs of rotator 320:

| 4-counter value (binary) | Rotator outputs | | |
|---|---|---|---|
| 00 | 01' | 23' | 45' |
| 01 | 67" | 01' | 23' |
| 10 | 45" | 67" | 01' |
| 11 | 23" | 45" | 67" |

Rotator 320 essentially re-samples the 8-bit wide input data over three original clock cycles into a 6-bit wide bus over four faster clock cycles (note that the increased clock rate is at 4/(4−1)=1.333 times the original clock rate). As illustrated in the table above, when the 4-counter produces 00, rotator 320 outputs 01', 23', 45'. When the 4-counter produces 01, rotator 320 outputs 67", 01', 23' (67" follows 01', 23', 45' in the previous cycle). When the 4-counter produces 10, rotator 320 outputs 45", 67", 01' (45", 67" follow 01', 23' in the previous cycle). When the 4-counter produces 11, rotator 320 produces 23", 45", 67", which follow 01' in the previous cycle. This way, all the data carried in three regular clock cycles can be resampled in four faster clock cycles and transmitted onto a 6-bit wide bus.

The outputs of rotator 320 are then coupled to an optional buffer stage which includes 2-bit registers 322, 324, and 326. These registers are triggered by the increased clock, CLOCK*N/(N−1), and thence re-synchronize the outputs of rotator 320 to the faster transmission clock. This re-synchronization buffer stage can produce a stable timing source, which facilitates clock and data recovery on the receiving end.

Switch circuit 328, which is controlled by failed channel indication signal 330, steers the 6-bit wide input bus to the three healthy channels. In this example, the output of register 322 is coupled to the input of SERDES 330, the output of register 324 is coupled to the input of SERDES 334, and the output of register 326 is coupled to the input of SERDES 336. SERDESs 330, 334, and 336 are driven by an increased transmission clock, TX CLOCK*N/(N−1). The state of switch circuit 328 does not change with time. It only changes if the failed channel indication signal 330 changes.

Figure 4:
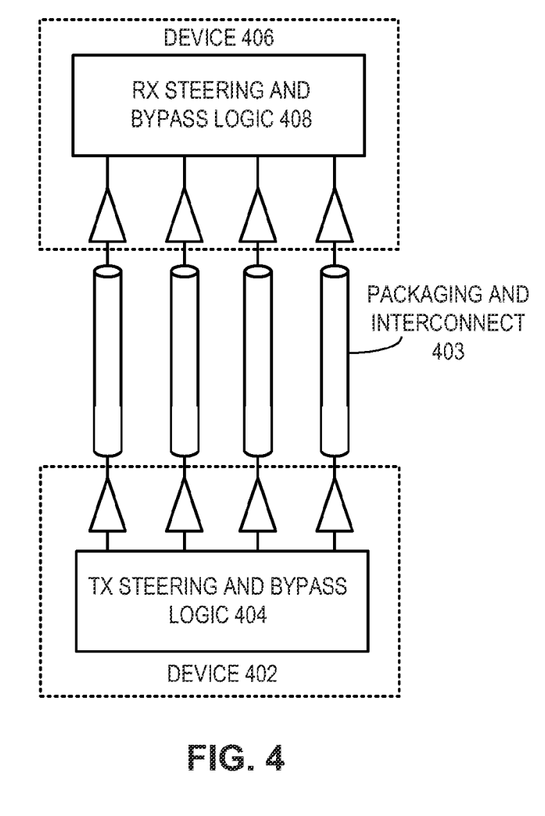
FIG. 4 illustrates an exemplary configuration for unidirectional inter-chip communication with temporal redundancy, in accordance with one embodiment.

The circuit configuration illustrated in FIG. 3 can be used for both transmission and receiving. FIG. 4 illustrates a temporal-redundancy configuration for unidirectional transmission. In this example, a device 402 includes a steering and bypass logic 404, which transmits data to a device 406 via packaging and interconnect 403. In device 406, a similar steering and bypass logic 408 receives the transmitted data. When one of the external channels fails, both steering and bypass logic 404 and 408 are configured such that the transmitted data is steered away from the failed channel.

Figure 5:
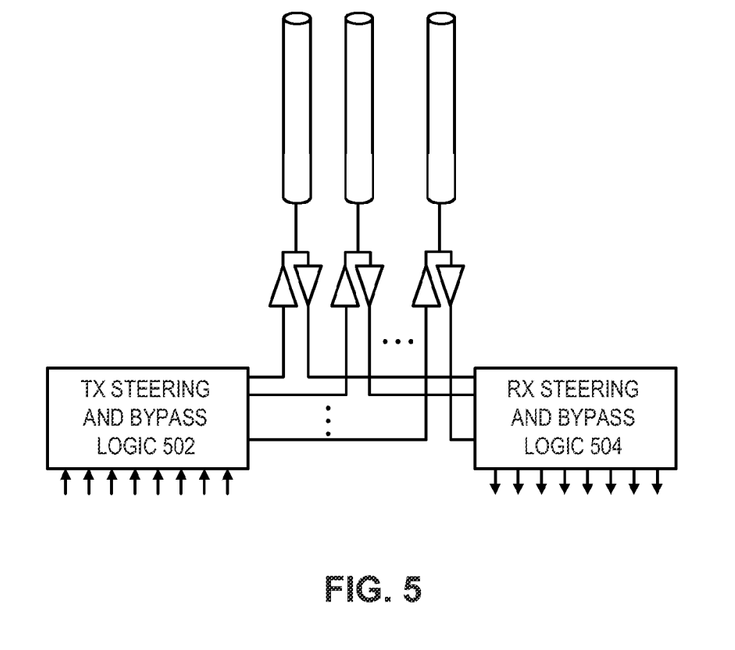
FIG. 5 illustrates an exemplary configuration of bidirectional inter-chip communication with temporal redundancy, in accordance with one embodiment.

FIG. 5 illustrates a temporal-redundancy configuration for bi-directional communication. Here two separate steering and bypass logic circuits 502 and 504 are provided for a chip. Transmission steering and bypass logic 502 is responsible for providing temporal redundancy for transmission, and receiving steering and bypass logic 504 is responsible for providing temporal redundancy for receiving data.

Figure 6A:
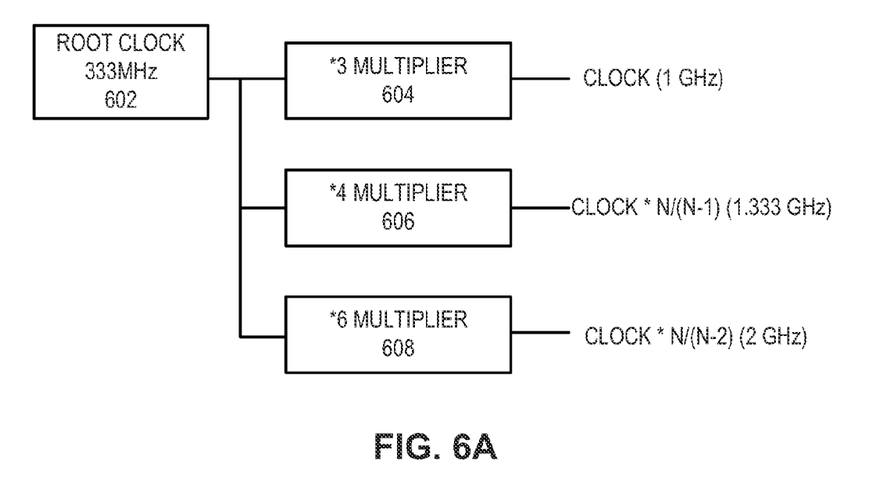
FIG. 6A illustrates an exemplary circuit for producing different clock rates for facilitating temporal redundancy, in accordance with one embodiment.

There are a number of ways to produce the increased clock rate. One method is to use a root clock rate that is the greatest common factor of the regular clock rate and the increased clock rate(s), as illustrated in FIG. 6A. In this example, assume that there are four channels, and the regular transmission clock rate is 1 GHz. Assume further that for purposes of temporal redundancy, two higher transmission clock rates are needed: one at 4/(4-1)=1.333 times the regular rate to accommodate one failed channel, and one at 4/(4-2)=2 times the regular rate to accommodate two failed channels. Correspondingly, the two increased transmission clock rates are at 1.333 GHz and 2 GHz, respectively.

Hence, in the example illustrated in FIG. 6A, a root clock rate 602 is chosen to be 333 MHz, which is the greatest common factor of 1 GHz, 1.333 GHz, and 2 GHz. Root clock rate 602 is then sent to three multipliers 604, 606, and 608. Multiplier 604 multiplies root clock rate 602 by 3 and produces a 1 GHz clock rate which is used as the regular transmission clock during normal operation. Multiplier 606 multiplies root clock rate 602 by 4 and produces a 1.333 GHz clock rate which is used as the increased transmission clock when one channel fails. Multiplier 608 multiplies root clock rate 602 by 6 and produces a 2 GHz clock rate which is used as the increased transmission clock when two channels fail.

Figure 6B:
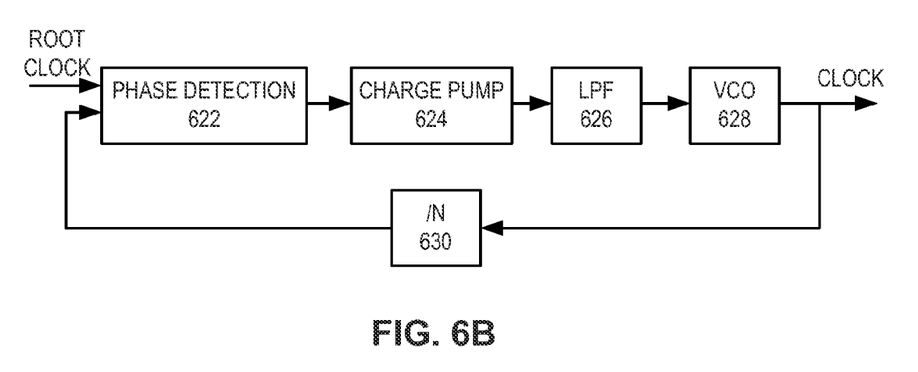
FIG. 6B illustrates an exemplary circuit for generating a receiver clock signal for facilitating temporal redundancy, in accordance with one embodiment.

On the receiving side, a phase-locking loop (PLL) can generate the desired receiving clock. FIG. 6B illustrates an exemplary PLL-based clock generation circuit. In this example, the PLL includes a phase detection circuit 622, a charge pump 624, a low pass filer (LPF) 626, a voltage controlled oscillator (VCO) 628, and an N-divider 630. A root clock signal (for example, a 333 MHz signal such as the root clock signal 602 in FIG. 6A), which is used as a reference clock, and the output of VCO 628 are fed into phase detection circuit 622. Charge pump 624 translates the output of phase detection 622 into a voltage signal. LPF 626 removes the high frequency noise in this voltage signal, which is then used to control the frequency of the output of VCO 628. In the lower portion of the feedback loop, the frequency of the output of VCO 628 is then divided by N by N-divider 630. The N-divided signal is then fed back to phase detection circuit 622. As a result, the output of VCO 628 stabilizes at N times the frequency of the root clock signal. For example, if the root clock is at 333 MHz and N is set to be 4, the output of VCO 628 would stabilize at 1.333 GHz, which can be used as the receiving clock signal to facilitate temporal redundancy where one out of four channels experiences a failure. (A separate clock and data recovery (CDR) circuit may be used to align the phase of the derived 1.333 GHz clock signal with the received data signals.)

Figure 7:
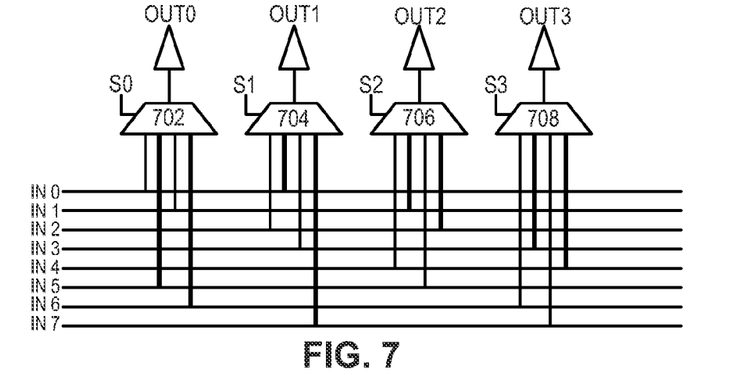
FIG. 7 illustrates another exemplary circuit that facilitates temporal redundancy for inter-chip communication, in accordance with one embodiment.

The circuit configurations illustrated in FIGS. 3, 4, 5, 6A, and 6B are one of several possible embodiments to facilitate temporal redundancy. FIG. 7 illustrates another possible embodiment for the transmission side. In this example, four serializers 702, 704, 706, and 708 are used to transmit eight data channels onto four external channels at double the internal data rate. Compared with the configuration in FIG. 2A, each serializer is coupled to four, instead of two, input data channels. (The additional connections are shown in thick lines.) This additional connectivity allows any three of the four serializers to fully cover all eight input data channels.

Each serializer is triggered by a separate, two-bit signal, i.e., S0, S1, S2, and S3, respectively. The value of this signal indicates which input is coupled to the output of a given serializer. For example, for serializer 702, when S0 is 00, input IN 0 is coupled to the output; when S0 is 01, IN 5 is coupled to the output; when S0 is 10, IN 1 is coupled to the output; and when S0 is 11, IN 6 is coupled to the output.

Figure 8:
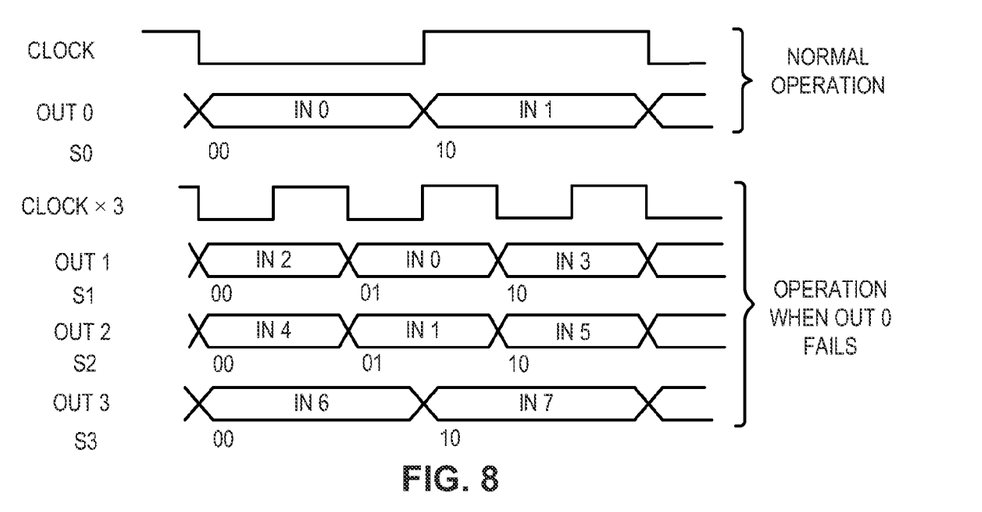
FIG. 8 presents an exemplary timing diagram illustrating the operation of the circuit in FIG. 7, in accordance with one embodiment.

The operation of these serializers can be explained in more detail in conjunction with the timing diagram illustrated in FIG. 8. Take serializer 702 for example. During normal operation, S0 toggles between 00 and 10 within a clock cycle (this is the same clock that drives the internal data channels, i.e., IN 0, IN 1, IN 2, etc.). As a result, serializer 702 transmits data from internal data channels IN0 and IN 1 within that cycle. Similarly, S1, S2, and S3 all toggle between 00 and 10 within a cycle, and serializers 704, 706, and 708 transmit from their corresponding default internal channels within that cycle (i.e., serializer 704 transmits from IN 2 and IN 3, serializer 706 transmits from IN 4 and IN 5, and serializer 708 transmits from IN 6 and IN 7).

Figure 9:
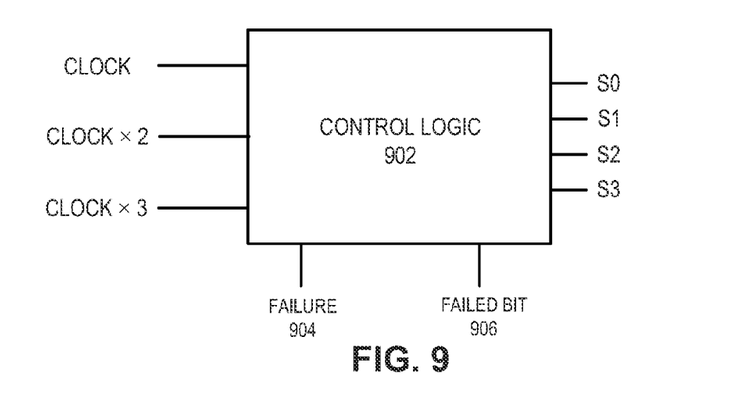
FIG. 9 presents a diagram illustrating an exemplary control logic for producing the control signals for the circuit in FIG. 7, in accordance with one embodiment.

Assume that external channel OUT 0 fails. The burden of transmitting from IN 0 and IN 1 is shifted to serializers 704 and 706, respectively. To allow serializer 704 to transmit from IN 0, IN 2, and IN 3 within one clock cycle, S1 now toggles among 00, 01, and 10 within that cycle. (The control circuit that generates S1, which is illustrated in FIG. 9, is driven by an increased clock signal operating at 3 times the regular clock rate.) Similarly, S2 also toggles among 00, 01, and 10 within that cycle. As a result, serializer 706 transmits from IN 4, IN 1, and IN 5 during the same cycle. This way, serializers 704 and 706 can jointly transmit from IN 0, IN 1, IN 2, IN 3, IN 4, and IN 5 during one clock cycle.

Meanwhile, S3 remains toggling between 00 and 10 within a clock cycle, and serializer 708 transmits from IN 6 and IN 7.

FIG. 9 illustrates an exemplary control logic for generating the toggle signals. In this example, a control logic 902 receives a failure indication signal 904 and a failed bit indication signal 906. Failure indication signal 904 indicates whether any external channel has failed, and failed bit indication signal 906 indicates which channel(s) has failed. Also provided to control logic 902 are three clock signals: a regular clock signal, a double-rate clock signal (CLOCK×2), and a triple-rate clock signal (CLOCK×3). The triple-rate clock signal is used to derive the toggle signals when one out of the four channels has failed. For example, in the failure scenario in FIG. 8, control logic 902 can use the triple-rate clock signal to generate S1 and S2.

The double-rate clock signal can be used to derive two toggle signals operating twice as fast as the normal rate when two out of the four channel fail. For example, if OUT 0 and OUT 1 both fail, control logic 902 can toggle S2 and S3 among 00, 01, 10, and 11 during a normal clock cycle, using the double-rate clock signal.

Figure 10:
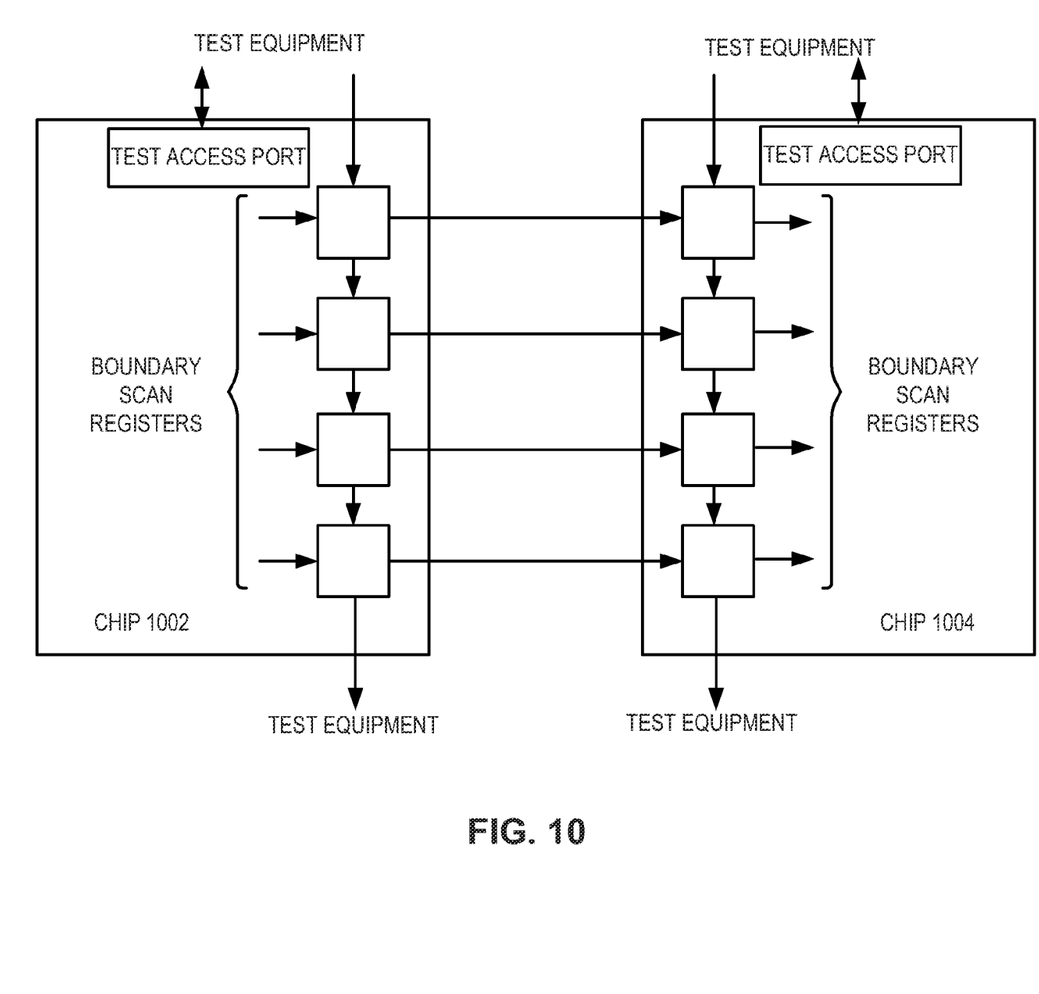
FIG. 10 illustrates an exemplary configuration for conducting external testing of communications between two chips, in accordance with one embodiment.

A number of methods can be used to diagnose interconnect failures. For example, pre-assembly test can detect failed interconnect structures, such as leakage or voids in TSVs. FIG. 10 illustrates an exemplary configuration for external testing. In this example, boundary scan is used to test the interconnect structures between two chips 1002 and 1004. Each chip has a set of boundary scan registers coupled to the interconnect ports. During testing, a given scan register within chip 1002 is loaded with a test pattern, which is then transmitted to chip 1004 and read by the chain of scan registers in chip 1004. Failed interconnect structures can be identified when the incoming and outgoing bits are compared in the test equipment. In one embodiment, the identity of the failed channel can be stored in a non-volatile memory on the chip, which can be later communicated to another chip to facilitate proper temporal redundancy configuration.

Figure 11:
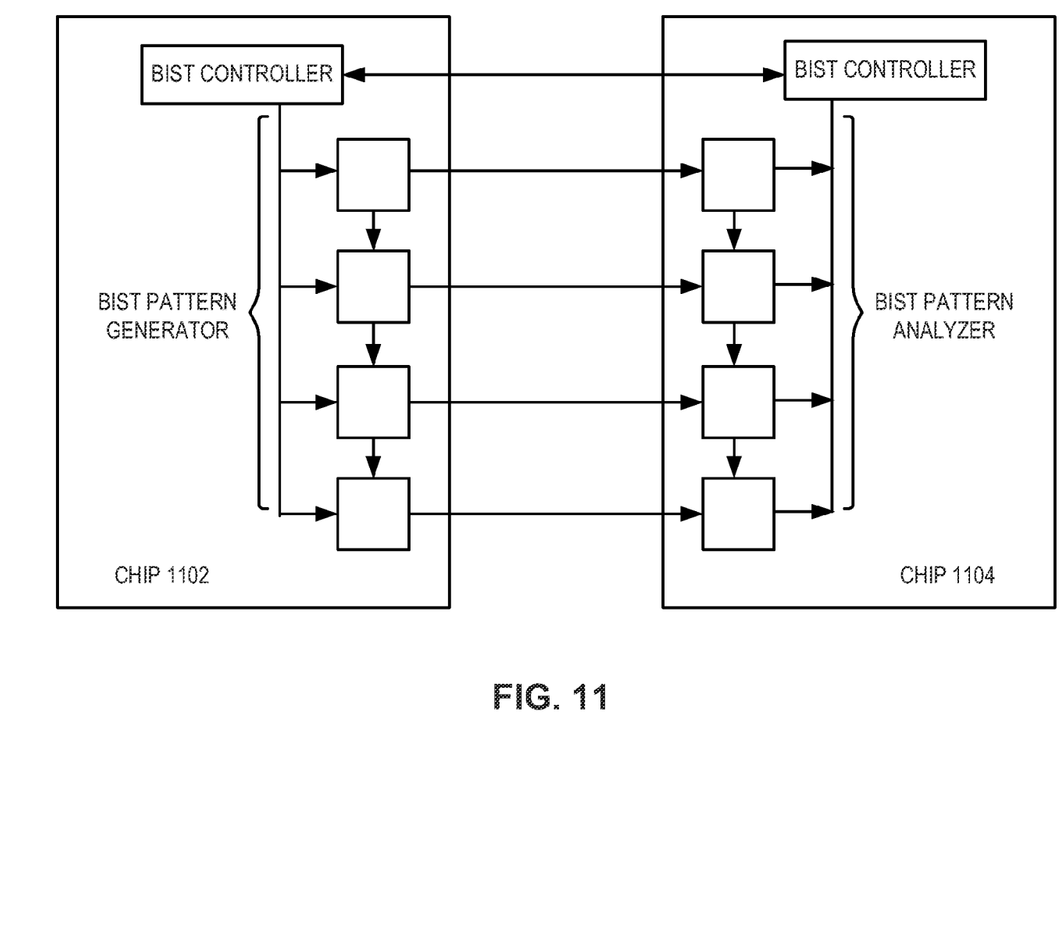
FIG. 11 illustrates an exemplary configuration for conducting on-chip testing of communications between two chips, in accordance with one embodiment.

Alternatively, Built-In Self Test (BIST) can be used post-assembly to detect failed interconnects. An example is illustrated in FIG. 11. Chips 1102 and 1104 each have a BIST controller and a scan chain (which includes a number of scan registers). On chip 1102, the BIST controller can generate a scan pattern, which is sent to chip 1104 and analyzed by the BIST controller in chip 1104. The test patterns can be directly sent via the output ports. In a further embodiment, a pseudo-random pattern can be generated by flip-flops at the output port configured as a Linear Feedback Shift Register (LFSR). The test patterns are sent to chip 1104, where they are received and either sent to the local BIST controller, or turned into a signature by the LFSR. If a failure is detected, the BIST controller can use the directed patterns to determine which bit has failed. Subsequently, the identity of the failed channel is communicated between the BIST controllers and used to configure the temporal redundancy.

One advantage of using BIST is it can be applied briefly upon power up to determine what interconnect structures have failed. The identity of the failed channel(s) can be stored in an on-chip volatile memory, which facilitates dynamic configuration of temporal redundancy and allows periodic retest and reconfiguration.

In some embodiments, a built-in test engine can generate a set of interconnect tests and then configure the temporal redundancy upon every chip start. If equalization is used, appropriate training sequence can be applied to determine the appropriate equalization settings. The training could occur on startup, periodically, or on-demand (for example, when the sufficient temperature changes warrant re-equalization).

Figure 12:
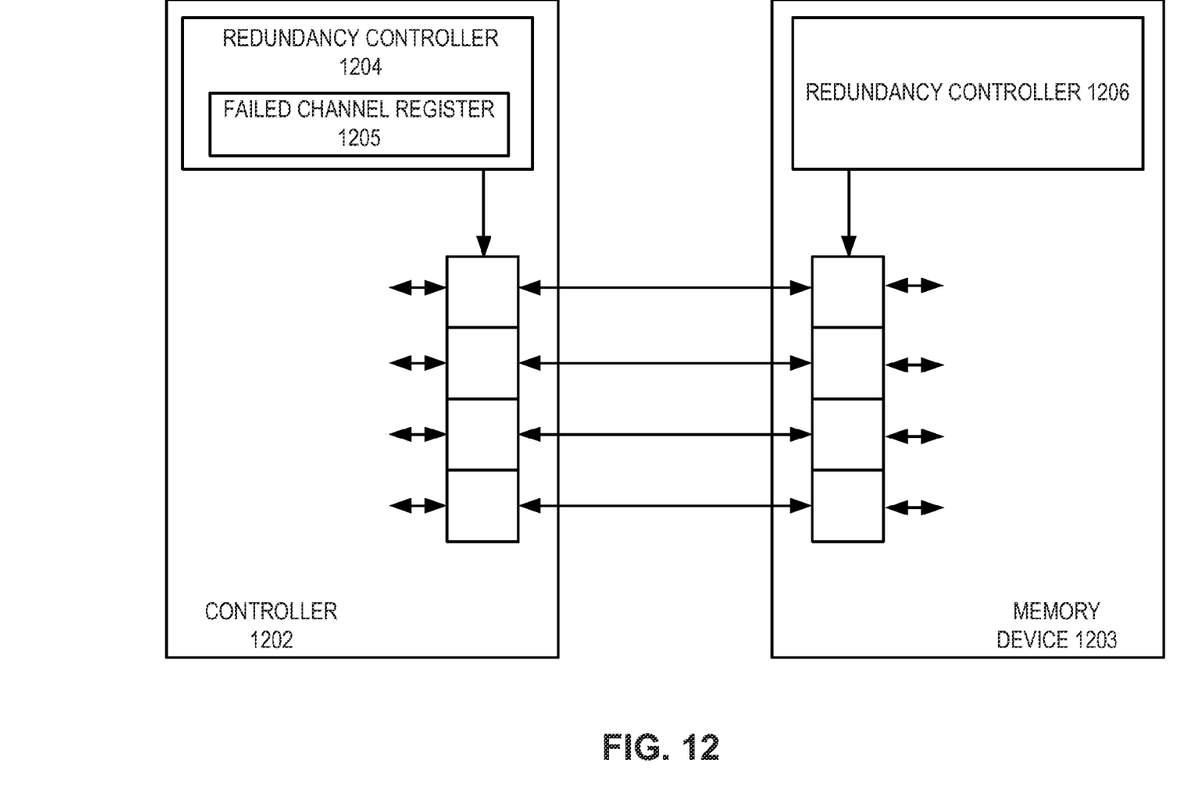
FIG. 12 illustrates an exemplary configuration of a memory controller and memory device that facilitates temporal redundancy for inter-chip communication, in accordance with one embodiment.

In scenarios where the communication is between a memory device and a memory controller, it might be desirable for a controller to control the test and reconfiguration. The redundancy management module can reside on the memory controller chip. An exemplary configuration is shown in FIG. 12. In this example, a memory controller 1202 includes a redundancy controller 1204, which further includes a failed channel register 1205. A memory device 1203 also includes a redundancy controller 1206. During operation, redundancy controller 1204 keeps track of the test status and configures the redundancy settings in both the master (controller 1202) and the slave(s) (memory device 1203). Redundancy controller 1204 maintains the identities of failed interconnect channels, which are stored in failed channel register 1205. If few failures are expected, failed channel register 1205 can be implemented as a small register file in which the identities of each failed channel is stored. If numerous failures are expected, one flip-flop (i.e., a one-bit register) could be assigned to each channel to indicate whether that channel has failed. Redundancy controller 1204 can use the information stored in failed channel register 1205 to determine how to best configure redundancy. For example, redundancy controller 1204 can use only spatial redundancy until all available physical spare channels are activated before using temporal redundancy. For temporal redundancy purposes, the identities of failed channels can be communicated to memory device 1203 in a number of ways. For example, a serial interface could be used between redundancy controllers 1204 and 1206. In a further embodiment, a test interface (such as the boundary scan pins) can be used for this communication. Redundancy controller 1206 can then use this information to program its receiver circuit accordingly to facilitate temporal redundancy and/or spatial redundancy.

In summary, embodiments of the present disclosure provide a system and method for overcoming inter-chip communication channel failures by providing temporal redundancy. When a failure occurs, data bits assigned to the failed channel are re-assigned to other channels and transmitted at a higher data rate.

In general, an output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit.

Although various formats may be used for such encoding, these data structures are commonly written in Caltech Intermediate Format (CIF), Calma GDS II Stream Format (GDSII) or Electronic Design Interchange Format (EDIF). Those of skill in the art of integrated circuit design can develop such data structures from schematic diagrams of the type detailed above and the corresponding descriptions and encode the data structures on a computer-readable medium. Those of skill in the art of integrated circuit fabrication can use such encoded data to fabricate integrated circuits comprising one or more of the circuits described herein.

While the present disclosure has been described in connection with specific embodiments, the claims are not limited to what is shown. Moreover, some components are shown directly connected to one another, while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. §112.

What is claimed is:

1. A circuit for coupling to inter-chip communication channels, comprising:
   a first circuit to indicate whether at least one inter-chip communication channel is faulty;
   a second circuit to distribute data bits associated with a faulty inter-chip communication channel to at least one non-faulty inter-chip communication channel; and
   a third circuit to generate a clock signal that clocks transmission of data bits to the inter-chip communication channels, the clock signal being at an increased data rate when the first circuit indicates that at least one inter-chip communication channel is faulty,
   wherein the second circuit comprises a plurality of serializers having outputs coupled to the inter-chip communication channels and inputs coupled to a number of internal data channels, wherein each of the plurality of serializers is triggered by a respective control signal that determines which of the internal data channels is coupled to the input of the respective one of the plurality of serializers.

2. The circuit of claim 1, wherein the second circuit comprises at least one buffer to buffer data bits associated with the faulty inter-chip communication channel so as to allow the buffered data bits to be transmitted by a non-faulty inter-chip communication channel at the increased data rate.

3. The circuit of claim 1, further comprising
   a bypass circuit to bypass the second circuit when no inter-chip communication channel is faulty.

4. The circuit of claim 1,
   wherein the third circuit includes at least one multiplier to produce a clock rate that is a multiple of a root clock rate.

5. The circuit of claim 1, wherein the control signal is configured to toggle at a rate higher than a normal toggle rate when the respective one of the plurality of serializers is used to transmit data bits associated with the faulty inter-chip communication channel.

6. The circuit of claim 1, further comprising
   a memory to store identity information of the inter-chip communication channel.

7. A method, comprising:
   receiving a first signal indicating at least one inter-chip communication channel is faulty; and
   transmitting, by a plurality of serializers coupled to a number of internal data channels, data bits associated with a faulty inter-chip communication channel and data bits associated with a non-faulty inter-chip communication channel, via the non-faulty inter-chip communication channel, at an increased data rate; and
   triggering a respective one of the plurality of serializers with a control signal that determines which of the internal data channels is coupled to an input of the respective one of the plurality of serializers.

8. The method of claim 7, further comprising
   receiving a second signal indicating an identity of the faulty inter-chip communication channel.

9. The method of claim 7, further comprising
   generating a clock signal corresponding to the increased data rate.

10. The method of claim 9,
    wherein generating the clock signal comprises multiplying a root clock signal.

11. The method of claim 7, further comprising
    buffering data bits associated with the faulty inter-chip communication channel prior to transmission.

12. The method of claim 7, further comprising
    toggling the control signal at a rate higher than a normal toggle rate when the respective one of the plurality of serializers is used to transmit data bits associated with faulty inter-chip communication channel.

13. The method of claim 7, further comprising
    transmitting identity information of the faulty inter-chip communication channel to a second chip.

14. The method of claim 7, further comprising
    storing identity information of the faulty inter-chip communication channel on the chip.

15. A memory controller, comprising:
    a register to store information indicating a faulty inter-chip communication channel;
    a first circuit to re-associate data bits originally associated with the faulty inter-chip communication channel with one or more non-faulty inter-chip communication channels; and
    a second circuit to generate a clock signal to facilitate transmission or receiving of the re-associated data bits via one or more non-faulty inter-chip communication channels at an increased data rate,
    wherein the second circuit comprises a plurality of serializers having inputs coupled to a number of internal data channels, wherein each of the plurality of serializers is triggered by a respective control signal that determines which of the internal data channels is coupled to the input of the respective one of the plurality of serializers.

16. The memory controller of claim 15, wherein the first circuit is to receive as input at least one of a failure indication signal, a failed bit signal, and an increased transmission clock signal.

17. The memory controller of claim 15, wherein the first circuit comprises at least one buffer to buffer data bits associated with the faulty inter-chip communication channel so as to allow the buffered data bits to be transmitted by a non-faulty inter-chip communication channel at the increased data rate.

18. The memory controller of claim 15, wherein the second circuit includes at least one multiplier to produce a clock rate that is a multiple of a root clock rate.

* * * * *